United States Patent [19]

Biegelsen et al.

[11] Patent Number: 5,567,957
[45] Date of Patent: Oct. 22, 1996

[54] SEGMENTED RESISTANCE LAYERS WITH STORAGE NODES

[75] Inventors: David Biegelsen, Portola Valley; Warren B. Jackson, San Francisco; Richard L. Weisfield, Los Altos, all of Calif.

[73] Assignee: Xerox Corporation, Stamford, Conn.

[21] Appl. No.: 368,138

[22] Filed: Jan. 3, 1995

[51] Int. Cl.[6] .................................................. H01L 29/04
[52] U.S. Cl. ............................ 257/57; 257/66; 257/379; 257/380; 257/536
[58] Field of Search ............................... 257/57, 66, 379, 257/380, 410, 536, 537, 538

Primary Examiner—Mark V. Prenty

[57] ABSTRACT

Resistance layer structures comprised of a plurality of conductive charge storage nodes, collection electrodes, and an electrically controllable resistance element which connects the storage nodes and the collection electrodes. The resistance of the electrically controllable resistance element can be switched between a low impedance, so as to permit a rapid charge interchange between the various storage nodes and the collection electrodes, and a high impedance, so as to permit an integration of charge onto the storage nodes. Beneficially, the electrically controllable resistance element is implemented as the active region of a metal-insulator-semiconductor device.

15 Claims, 2 Drawing Sheets

SEGMENTED RESISTANCE LAYERS WITH STORAGE NODES

FIELD OF THE INVENTION

The present invention relates to devices which store and output spatially varying charge information.

BACKGROUND OF THE INVENTION

Resistance layers—layers of resistive material with electrodes placed in various patterns for charge injection and/or sensing—play an important role in many applications that process spatial information. If a localized region of charge is injected into the resistance layer, that charge spreads out over the resistance layer in a period of time. That charge spreading can be used to perform useful processing functions based on the spatial information of the charge distribution. For example, charge spreading can be used to form convolutions of images with various kernels, to determine the positions of spots in position sensors, and to create overlapping sensors.

The characteristics of charge spreading in the resistance layer depends on the electrical properties of the resistance layer, the elapsed time, and the properties of the charge collection electrodes attached to the resistance layer. The electrical properties of the resistance layer that determine the characteristics of the charge spreading (and therefore the uses of the resistive layer) include the sheet resistance, capacitance, leakage conductance, and the unipolar or ambipolar nature of the charge carriers. A low sheet resistance and/or a small capacitance lead to rapid charge spreading. In most practical applications, typical sheet resistances, capacitances, and dimensions result in the diffusion of charge throughout the resistance layer in milliseconds.

Collection electrodes are electrodes which are used to inject charges into the resistance layer and/or to read out the existing charge. If the collection electrodes are terminated with low impedances (such as being grounded), the collection electrodes act as sinks for the charges in the resistance layer. Consequently, charges do not diffuse significantly beyond low impedance collection electrodes. However, if the collection electrodes are terminated with a high impedance (such as being left floating), the charge spreads beyond the collection electrodes. In most applications, grounded collection electrodes are used. Position sensitive detectors, for example, determine the centroid of photoinduced charges in a resistance layer by measuring the currents flowing to two or more collection electrodes held near ground potential.

In applications using a small number of collection electrodes, low impedance terminations are practical since each collection electrode can have a dedicated external line (a line which connects the collection electrode to external circuitry) and associated processing electronics. However, in applications requiring a large number of collection electrodes, multiplexing the charge signals from many collection electrodes into the associated processing electronics becomes essential. While multiplexing greatly reduces the number of external lines and associated processing electronics, integration of the charge may be required in order to maintain an acceptable signal-to-noise ratio of the multiplexed charge signals. The term integration is taken to refer to fact that the charge induced on the resistance layer builds up during the time when the charge on the resistance layer is not being read (addressed by the multiplexer).

Multiplexing is often incompatible with low impedance terminated collection electrodes since the charge collected between each multiplexed access to the electrode must be stored. While this problem can be alleviated by increasing the sheet resistance of the resistance layer, a large sheet resistance is also often incompatible with multiplexing since an excessive amount of time would be required to remove charges built up on the resistance layer.

It is therefore highly desirable to have resistance layer structures which accomplish the charge spreading functions of previous resistance layers, but which are also more compatible with multiplexing. Such resistance layer structures should integrate charge when not being addressed by the multiplexer, and should allow rapid movement of the integrated charge into the collection electrodes when the resistance layer structure is being addressed by the multiplexer.

SUMMARY OF THE INVENTION

The principles of the present invention provide for resistance layer structures which are compatible with multiplexing. Such resistance layer structures include a plurality of conductive charge storage nodes which are connected to each other and to collection electrodes by an electrically controllable resistance element. The resistance of the resistance element can be switched between a low impedance, so as to permit a rapid charge interchange between the various storage nodes and the collection electrodes, and a high impedance, so as to permit an integration of charge onto the storage nodes.

Beneficially, the resistance layer structure's electrically controllable resistance elements are implemented as an active region of a metal-insulator-semiconductor structure. The resistance of the active region is set high when the resistance layer structure is integrating charge. With a high resistance, the spatial information of any induced charge (such as from a light sensitive PN junction) is accumulated and stored on the storage nodes and is thus integrated over time. When the integrated charge is to be read (such as when an external multiplexer connects the collection electrodes to associated processing electronics) the resistance of the active region is set low, reducing the resistances between the storage nodes and collection electrodes. This permits the integrated charge's spatial information to be transferred rapidly to the collection electrodes. The present invention may be used in image input devices such as scanners, image output devices such as displays, and in numerous other applications such as variable rate image convolvers.

BRIEF DESCRIPTION OF THE DRAWINGS

Other aspects of the present invention will become apparent as the following description proceeds and upon reference to the drawings, in which.

Figure 1:
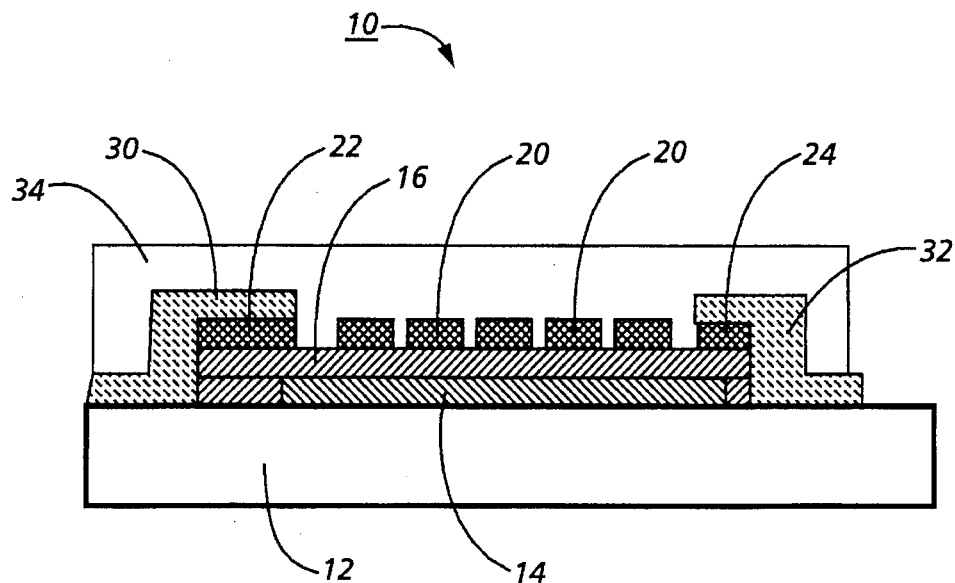
FIG. 1 schematically illustrates a cut-away view of a first embodiment resistance layer structure according to the principles of the present invention.

Note that in the drawings like numbers designate like elements. Additionally, the subsequent text includes various directional signals (such as right, left, up, down, top, bottom, lower and upper) which are related to the drawings. Those directional signals are meant to aid the understanding of the present invention, not to limit it.

DETAILED DESCRIPTION OF THE PREFERRED EMBODIMENTS

Overview

The principles of the present invention provide for resistance layer structures that are capable of integrating spatially varying charge distributions and subsequently quickly outputting the integrated charge. Devices made according to the present invention are capable of storing, varying, and multiplexing spatial charge information onto external multiplex lines.

The present invention is related to the technology described in co-pending U.S. patent applications Ser. No. 08/368,131, entitled, "PIXEL ELEMENTS HAVING RESISTIVE DIVIDER ELEMENTS," and Ser. No. 08/368,114, entitled, "INTEGRATING HYPERACUITY SENSORS AND ARRAYS THEREOF." Those patent applications are hereby incorporated by reference.

A First Embodiment Resistance Layer

Figure 2:
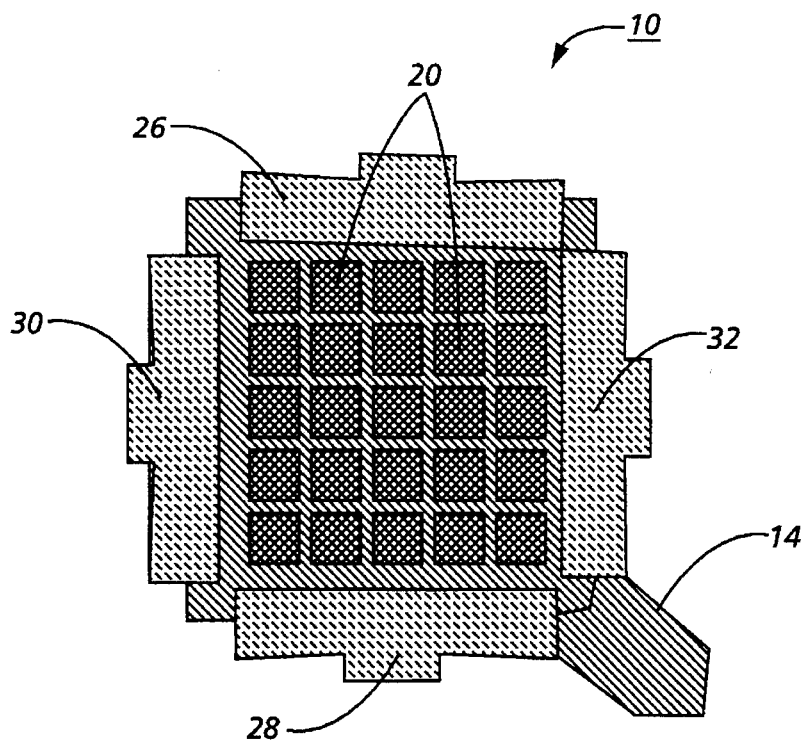
FIG. 2 shows a top down view of the resistance layer structure illustrated in FIG. 1.

A more detailed understanding of the principles of the present invention may result from studying the first embodiment resistance layer structure 10 which is illustrated in FIGS. 1 and 2. The resistance layer structure 10 is comprised of a substrate 12 (only shown on FIG. 1) over which is located a gate electrode 14. While the substrate may be made from a very large number of materials, including insulators (such as glass) and semiconductors (such as silicon), the substrate 12 is made from amorphous glass. Usually it will be beneficial to make the gate electrode either from chrome, as is the case of the gate electrode 14, or from heavily doped silicon. Over the gate electrode is an insulating dielectric layer 16 (only shown on FIG. 1). Since the resistance layer structure 10 has an active region (subsequently described) made from amorphous silicon, the resistance layer structure 10 uses a dielectric layer 16 made from plasma enhanced chemical vapor deposited silicon nitride because that material is found to provide the lowest density of interface electronic traps.

Over the dielectric layer are a plurality of conductive islands. Some of those islands are relatively small and form storage nodes 20. Other islands are relatively large and elongated and are used as collection electrode contacts, the contacts 22 and 24. It is to be understood that there are additional contacts to gate layer 14 which are not shown in either FIG. 1 or 2, but which are assumed to be under the subsequently discussed collection electrodes 26 and 28 shown in FIG. 2. The storage nodes and the collection electrode contacts are beneficially formed photolithographically by first depositing conductive layers, say of chrome and n-type, phosphorus-doped amorphous silicon, over the insulating dielectric layer 16, masking the deposited chrome/n-type amorphous silicon layer, and then patterning the storage nodes and contacts by etching.

Disposed over the collection electrode contacts are electrically conductive metallic electrodes, the collection electrodes 26, 28, 30 and 32. While the simplest resistance layer structure would have only one set (two) of collection electrodes, having a collection electrode along each edge of the resistance layer structure 10 enables complex two dimensional charge information to be interrogated.

Over the storage nodes, the electrodes, and the exposed portions of the dielectric layer 16 is a layer of deposited amorphous silicon 34 (shown only in FIG. 1). The amorphous silicon layer is formed such that while it has a high resistance, it makes low resistance contacts with the storage nodes and with the electrodes.

The above description together with FIGS. 1 and 2 illustrate a first embodiment of the present invention. That embodiment forms a charge integration, storage, and output control structure suitable for a number of applications as is subsequently described. It is to be understood that additional structures can be added to the illustrated and described structure. For example, a photodetector can readily be added over the amorphous silicon layer 34 or a liquid crystal material can be placed over the amorphous silicon layer 34.

Figure 3:
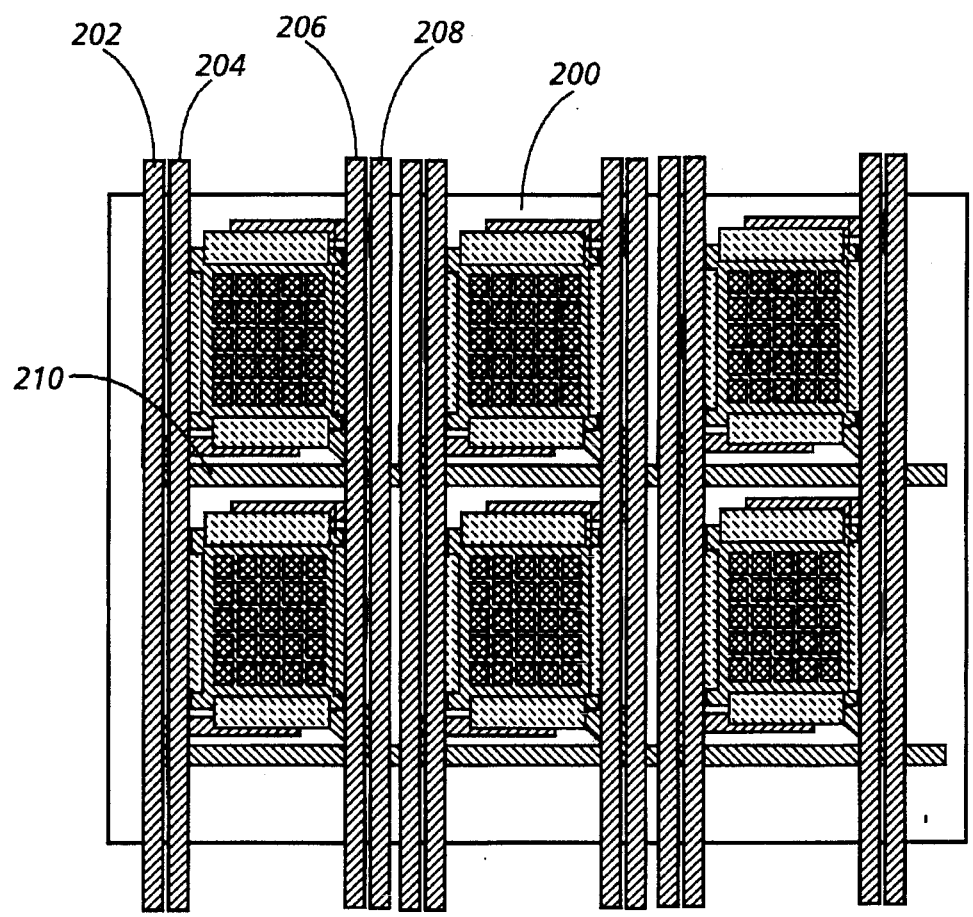
FIG. 3 shows a top down view of an array of resistance layer structures sharing a continuous resistive sheet.

Another extension of the inventive resistance layer structure 10 is shown in FIG. 3. There a plurality of resistance layer structures are fabricated on a continuous resistive layer 200. The resistive layer includes a multiplicity of electrodes 202–208 and gate lines 210 which interconnect the resistance layer structures. The electrodes 202–208 and the gate lines 210 allow the individual resistance layer structures to be multiplexed.

Operation and Use

In FIGS. 1 and 2 the amorphous silicon layer 34 of the resistance layer 10 has a resistance that can be varied by voltages applied to the gate electrode 14. It is significant that that resistance can be varied by more than three orders of magnitude. The voltage controlled resistance makes the resistance layer useful in a number of applications. For example, it can be used as a storage device for spatially varying potentials impressed by external lines onto the electrodes 26 through 32 or as a charge integrator for charge distributions created by the illumination on a photodetector.

In the first application, voltages are applied to the collection electrodes 26 through 32 and to the gate electrode 14. The voltage to the gate electrode reduces the resistance between the storage nodes 20 and the collection electrodes 26 through 32. The voltages on the collection electrodes 26 through 32 create current flows across the now relatively low resistance amorphous silicon layer. Those currents create spatially varying electric fields and charges on the storage nodes 20. When the voltage applied to the gate electrode is removed, the resistance of the amorphous silicon layer increases dramatically, trapping charges on the storage nodes. Those trapped charges, and their resultant fields, can be stored for relatively long periods of time. With a low voltage applied to the gate electrode, voltages applied to the collection electrodes 26 through 32 can be altered without disturbing the charge on the storage nodes. This use of the resistance layer would be beneficial in liquid crystal displays since the fields from the charges trapped on the storage nodes could be used to control a light valve.

As mentioned, the resistance layer 10 can be used to store the internal spatial distributions of photoinduced charge. In such an application, a photodetector, such as a vertical photodiode or photoconductor, is placed over the amorphous silicon layer. Light is then radiated onto the photodetector and a low voltage is applied to the gate electrode 14. That low voltage increases the resistance of the amorphous silicon layer. The photoinduced charge then accumulates on the storage nodes 20 in accordance with the light intensity applied to the photodetector at the various locations and the time period during which light is applied; the charges integrate onto the storage nodes 20. When the stored spatial charge is to be readout, the collection electrodes 26 through 32 are grounded and a large positive bias is applied to the gate electrode 14. This reduces the resistance of the amorphous silicon layer between the storage nodes and the electrodes 26 through 32. The charges stored on the storage nodes divides and flows out of the various collection electrodes 26 through 32. The charges out of the collection electrodes 26 through 32 can be used to determine the centroids of the illuminating light and other characteristics of the charge distribution.

A Second Embodiment Segmented Resistance Layer

Figure 4:
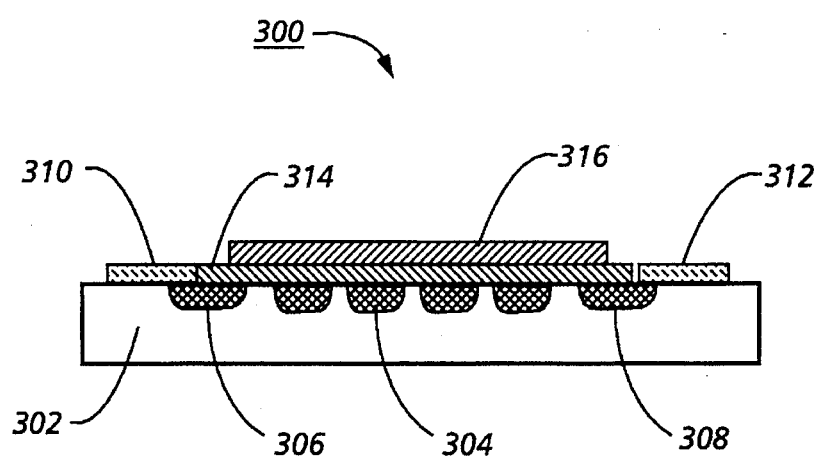
FIG. 4 illustrates an alternative embodiment resistance layer structure which is particularly beneficial for use with crystalline silicon active regions.

Devices similar to the first embodiment segmented resistance layer 10 are likely to be used with noncrystalline materials since their active layers, which correspond to the amorphous silicon layer 34 of the resistance layer 10, are easily formed after the fabrication of the noncrystalline dielectric layers and metals. In other applications it would be beneficial to apply the principles of the present invention to devices having active semiconductor layers comprised of crystalline materials. FIG. 4 shows a second embodiment resistance layer 300 which uses an intrinsic crystalline silicon substrate 302 which acts as the active layer. Implanted into the top of the crystalline silicon substrate and thermally activated are a plurality of doped storage nodes 304 and collection electrodes 306 and 308. While only two collection electrodes are used in the resistance layer 300, many applications will benefit from the use of four collection electrodes (or more) as in the resistance layer 10. Over the collection electrodes are metal contacts 310 and 312. Over the substrate, collection nodes, and as shown in FIG. 4, some parts of the collection electrodes 306 and 308 is a dielectric layer 314. Since the substrate 302 is crystalline silicon, the dielectric layer 314 is beneficially of silicon dioxide. The dielectric layer is beneficially formed by thermal means or by deposition. Over the dielectric layer is a transparent gate electrode 316, beneficially of indium tin oxide or heavily doped polycrystalline silicon.

The resistance layer 300 works in a manner similar to the resistance layer 10. A voltage applied to the gate electrode 316 can change the resistance of the active layer by over three orders of magnitude. Charges induced into the storage nodes 304 are integrated when the gate electrode voltage is low and are applied to the collection electrodes 306 and 308 when the gate electrode voltage is high. Thus, the resistance layer 300 can be used in the same applications as the resistance layer 10. However, since large area liquid crystal displays and scanners having crystalline silicon substrates are not presently practical, the second embodiment segmented resistance layer 300 is presently limited to relatively small area applications.

It is to be understood that while the figures and the above description illustrate the present invention, they are exemplary only. Others who are skilled in the applicable arts will recognize numerous modifications and adaptations of the illustrated embodiment which will remain within the principles of the present invention. Therefore, the present invention is to be limited only by the appended claims.

What is claimed:

1. A resistance layer structure comprised of:

a plurality of conductive storage nodes for storing induced charges;

at least two conductive current electrodes; and an electrically controllable resistance layer having an electrical input, said electrically controllable resistance layer being in a low resistance, touching relationship with both said storage nodes and said at least two conductive current electrodes, said electrically controllable resistance layer having a relatively high resistance when a first electrical signal is applied to said electrical input and relatively low resistance when a second electrical signal is applied to said electrical input;

wherein charge flows relatively quickly between said storage nodes and said at least two conductive current electrodes, when said second electrical signal is applied to said electrical input, and wherein charge flows relatively slowly between said storage nodes and said at least two conductive current electrodes when said first electrical signal is applied to said electrical input.

2. The resistance layer structure according to claim 1, wherein said electrically controllable resistance layer includes a semiconductor active region.

3. The resistance layer structure according to claim 2, wherein said electrical input is a gate electrode.

4. The resistance layer structure according to claim 3, further including an isolation layer between said semiconductor active region and said gate electrode.

5. The resistance layer structure according to claim 4 wherein said semiconductor active region is noncrystalline silicon.

6. The resistance layer structure according to claim 5 wherein said isolation layer is silicon nitride.

7. The resistance layer structure according to claim 4 wherein said semiconductor active region is crystalline silicon.

8. The resistance layer structure according to claim 7 wherein said isolation layer is silicon dioxide.

9. The resistance layer structure according to claim 1 wherein said at least two current electrodes are connected by a continuous resistance layer structure.

10. A resistive layer structure comprised of:

a substrate;

a gate electrode over said substrate;

an isolation layer over said gate electrode;

a plurality of conductive storage nodes for storing charge over said isolation layer;

at least two conductive current contacts over said isolation layer; and a semiconductor active region in a low resistance, touching relationship with both said storage nodes and said at least two current contacts;

wherein said semiconductor active region has a relatively high resistance between said storage nodes and said at least two current contacts when a first electrical signal is applied to said gate electrode and a relatively low resistance between said storage nodes and said at least two current contacts when a second electrical signal is applied to said gate electrode.

11. The resistance layer structure according to claim 10 wherein said semiconductor active region is noncrystalline silicon.

12. The resistance layer structure according to claim 10 wherein said isolation layer is silicon nitride.

13. A resistive layer structure comprised of:

a semiconductor active region;

a plurality of conductive storage nodes for storing charge formed in said semiconductor active region;

at least two conductive current contacts formed in said semiconductor active region;

an isolation layer over said semiconductor active region;

a gate electrode over said isolation layer;

wherein said semiconductor active region has a relatively high resistance between said storage nodes and said at least two current contacts when a first electrical signal is applied to said gate electrode and a relatively low resistance between said storage nodes and said at least two current contacts when a second electrical signal is applied to said gate electrode.

14. The resistance layer structure according to claim 13 wherein said semiconductor active region is crystalline silicon.

15. The resistance layer structure according to claim 13 wherein said isolation layer is silicon dioxide.

* * * * *